(12) United States Patent
Satyamoorthy et al.

(10) Patent No.: US 9,735,701 B2
(45) Date of Patent: Aug. 15, 2017

(54) CIRCUIT AND METHOD FOR MEASURING AVAILABLE POWER IN A WIRELESS POWER SYSTEM

(71) Applicant: MediaTek Singapore Pte. Ltd., Singapore (SG)

(72) Inventors: Anand Satyamoorthy, Somerville, MA (US); Patrick Stanley Riehl, Cambridge, MA (US)

(73) Assignee: MEDIATEK Singapore Ptd. Ltd., Solaris (SG)

( * ) Notice: Subject to any disclaimer, the term of this patent is extended or adjusted under 35 U.S.C. 154(b) by 8 days.

(21) Appl. No.: 13/954,969

(22) Filed: Jul. 30, 2013

(65) Prior Publication Data

US 2014/0036560 A1    Feb. 6, 2014

Related U.S. Application Data

(60) Provisional application No. 61/679,309, filed on Aug. 3, 2012.

(51) Int. Cl.
| | |
|---|---|
| *G05F 5/00* | (2006.01) |
| *H02M 7/06* | (2006.01) |
| *H02J 5/00* | (2016.01) |
| *G01R 29/08* | (2006.01) |

(52) U.S. Cl.
CPC ........ *H02M 7/066* (2013.01); *G01R 29/0871* (2013.01); *H02J 5/005* (2013.01)

(58) Field of Classification Search
CPC .. H02J 1/10; H02J 5/005; H01F 29/02; H01F 38/10; A47L 9/2857; H02M 3/156; H02M 3/1588; H02M 7/066; G01R 29/0871; G05F 1/67

USPC ....... 323/205, 207, 222, 223, 271, 282, 283, 323/285, 266, 299, 300; 363/89; 307/19, 307/21, 22, 104, 149; 320/108

See application file for complete search history.

(56) References Cited

U.S. PATENT DOCUMENTS

| | | | | |
|---|---|---|---|---|
| 5,546,331 | A | * | 8/1996 | Mathews ............... G01R 19/25 323/266 |
| 8,598,856 | B1 | * | 12/2013 | Carroll ................ H02M 3/1588 323/282 |
| 2007/0228833 | A1 | * | 10/2007 | Stevens ................... H02J 5/005 307/45 |
| 2009/0224609 | A1 | * | 9/2009 | Cook ....................... H02J 17/00 307/104 |
| 2009/0286476 | A1 | * | 11/2009 | Toncich et al. .............. 455/41.1 |
| 2010/0176771 | A1 | * | 7/2010 | Fieldhouse et al. .......... 323/234 |
| 2010/0277003 | A1 | * | 11/2010 | Von Novak et al. ......... 323/283 |
| 2011/0096576 | A1 | * | 4/2011 | Takahashi et al. ............. 363/44 |

(Continued)

FOREIGN PATENT DOCUMENTS

| | | |
|---|---|---|
| CN | 102378332 A | 3/2012 |
| CN | 102439820 A | 5/2012 |

*Primary Examiner* — Alex Torres-Rivera
(74) *Attorney, Agent, or Firm* — Wolf, Greenfield & Sacks, P.C.

(57) ABSTRACT

A resonant wireless power receiver that includes an electromagnetic resonator having one or more inductive elements that are arranged to form a receiver coil and a network of passive components arranged to form a matching network. A rectifier circuit converts ac power from the electromagnetic resonator to dc power. An available-power indicator measures the rectified power to assess the instantaneous power available to the receiver.

15 Claims, 5 Drawing Sheets

(56) References Cited

U.S. PATENT DOCUMENTS

| | | | |
|---|---|---|---|
| 2011/0273016 A1* | 11/2011 | Adest et al. | 307/52 |
| 2012/0104867 A1* | 5/2012 | Mudrick | H02J 7/025 |
| | | | 307/104 |
| 2012/0235509 A1* | 9/2012 | Ueno | H02J 5/005 |
| | | | 307/104 |

* cited by examiner

CIRCUIT AND METHOD FOR MEASURING AVAILABLE POWER IN A WIRELESS POWER SYSTEM

CROSS REFERENCE TO RELATED APPLICATIONS

This application claims priority from provisional application Ser. No. 61/679,309 filed Aug. 3, 2012, which is incorporated herein by reference in its entirety.

BACKGROUND

The invention is related to field of wireless systems, and in particular to a wireless power receiver that can independently make a measurement of instantaneous available power.

In a resonant wireless power (RWP) system, multiple receiver devices can simultaneously receive power from a single source through near-field magnetic coupling. The coupling factor or mutual inductance of each receiver coil to the source coil may vary according to the relative position and orientation of the coils. Even if the receiver coils do not couple directly to each other, each can affect the power transfer of the other through interactions with the source coil. The source is necessarily limited in the amount of power it can deliver to receivers. Thus the available power to any one receiver device at a given time is a function not only of its orientation with respect to the source coil, but also the state of other receiver coils in the system.

In order for the wireless power system to provide a good user experience, an assessment must be made of this available power. To understand why this is the case, consider a hypothetical wireless power system in which available power is not known. Suppose that a device is introduced into the wireless power field for the purpose of charging its battery. A voltage may appear at the output of the wireless power converter, indicating to the receiver device that power is available to charge the battery. However, suppose that conditions are such that only 0.5 W can be drawn from the wireless power source. If the device uses 1 W to charge its battery, initiating charging will cause the power system to collapse. The voltage at the output of the wireless power converter will drop out, causing charging to terminate. It may then recover, leading to limit-cycling behavior. Furthermore, the overloading on the wireless power source may affect the power transfer to other devices in the system.

SUMMARY

According to one aspect of the invention, there is provided a resonant wireless power receiver comprising. The resonant wireless power receiver includes an electromagnetic resonator having one or more inductive elements that are arranged to form a receiver coil and a network of passive components arranged to form a matching network. A rectifier circuit converts ac power from the electromagnetic resonator to dc power. An available-power indicator measures the rectified power to assess the instantaneous power available to the receiver.

According to another aspect of the invention, there is provided method of measuring available power of a resonant wireless power receiver circuit. The method includes providing an electromagnetic resonator that includes one or more inductive elements that are arranged to form a receiver coil and a network of passive components arranged to form a matching network. Also, the method includes converting ac power using a rectifier circuit from the electromagnetic resonator to dc power. Furthermore, the method includes measuring the rectified power an available-power indicator to assess the instantaneous power available to the receiver.

DETAILED DESCRIPTION

This invention describes a methodology by which a wireless power receiver can independently make a measurement of instantaneous available power. The receiver can use this information to intelligently control its power draw, ensuring a good user experience.

Figure 1:
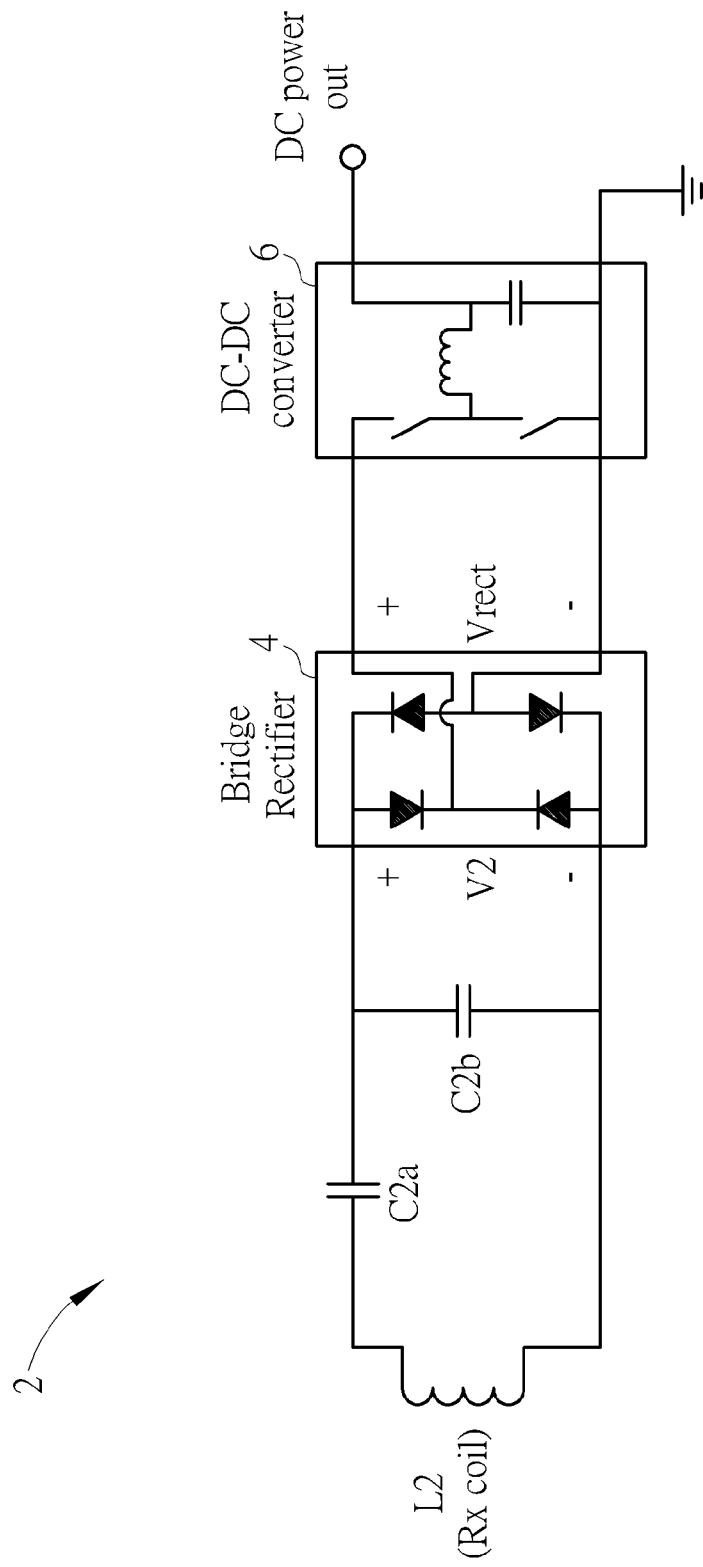
FIG. 1 is schematic diagram illustrating a simplified schematic of a wireless power receiver.

FIG. 1 shows a simplified schematic of a wireless power receiver circuit 2. Energy coupled into inductor L2 from the source inductor (not shown) is rectified by the bridge rectifier 4, and then regulated by the dc-dc converter to produce a regulated output voltage. The matching network formed by C2a and C2b is resonant with L2, causing the receiver circuit 2 to present a matched impedance to the source at the resonant frequency. The bridge rectifier 4, dc-dc converter 6 and load circuit can be modeled as a resistor RL as shown in circuit 10 of FIG. 2. The peak ac voltage across RL, V2, is roughly equal to the rectified voltage appearing at Vrect.

There is a value of RL for which the impedances in the system are matched and power transfer into RL is maximized. Even though there is no physical RL in the real wireless power system, the same conditions apply if the equivalent resistance of the rectifier plus load circuit is calculated. In order to ensure stable operation of the wireless power system, we operate at resistances greater than this critical value of RL.

Figure 2:
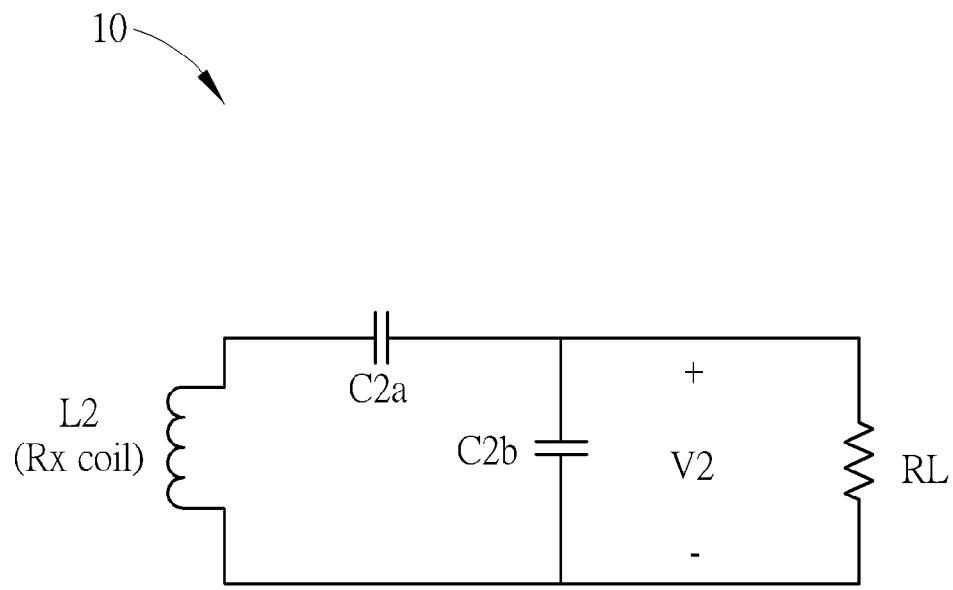
FIG. 2 is a schematic diagram illustrating an AC model of the resonant wireless power receiver circuit.
Figure 3:
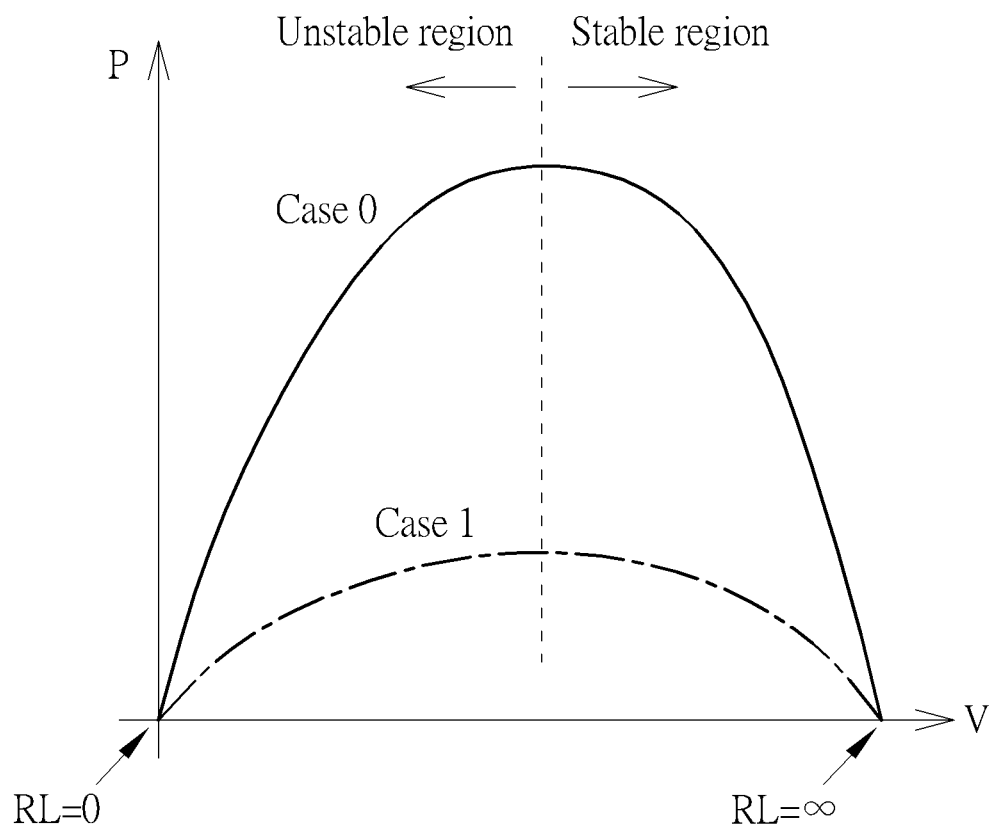
FIG. 3 is a graph illustrating PV curves for two operating conditions used in accordance with the invention.

FIG. 3 shows the power and voltage delivered to a load resistor using a wireless power receiver similar to FIG. 2. The power maximum that occurs at the ideal matched impedance is clearly visible in the power graph. This maximum power occurs at a voltage lower than the unloaded voltage on the right of the voltage graph. Two conditions are shown in the graphs of FIG. 3: one in which the available power is relatively high (case 0), and one in which it is relatively low (case 1). Available power is affected by the coupling factor, the current in the source coil, and the presence of other receivers in the system. The source power has been adjusted such that the unloaded voltage in both conditions is about equal.

In a practical wireless power system, the load resistance is not a controlled variable. The dc-dc converter constantly adjusts its input resistance to deliver the necessary power to the load. The coupling factor to the source is also unknown to the receiver. The only state in which the wireless power receiver knows the output power is if it has gated the output power by opening a switch or disabling its output regulator.

This is the unloaded condition, represented on the graphs as the maximum RL point. Consider a wireless power receiver that is powered up into the unloaded condition in either Case 0 or Case 1 from FIG. 3. Since the voltages are identical, there is no way to determine what conditions the receiver is operating under, and thus no way to assess how much power can be drawn without reaching an overload condition. Thus there is a need for a method of assessing the available power in a wireless power system using measurements that are reasonable for the receiver to make.

Figure 4:
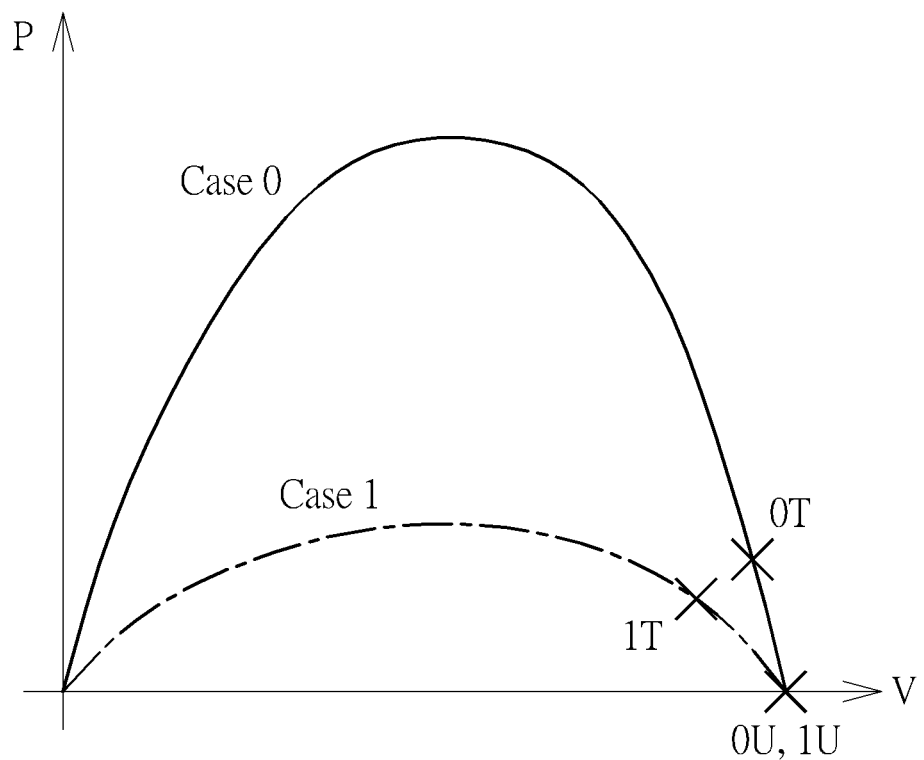
FIG. 4 is a graph illustrating PV curves showing test-load points for two cases used in accordance with the invention.

It has been demonstrated that a single-point measurement of the rectified voltage is insufficient to assess available power. However, a two-point measurement could be used to assess available power. Suppose the wireless power receiver could measure power at two values of RL: RLU, a very large value, and RLT, some "test" value. Suppose that the test value is higher than the RL required to draw the rated power, but not by a large ratio. The measurements taken at these two values of RL are represented in the example of FIG. 4 as points 0U, 0T, 1U and 1T. The values of the points on the PV curves in this example are given in Table 1. In case 0, the voltage drop when drawing 1 W is only 0.5V out of 16 V. From what the shape of the power and voltage curves, one can conclude that substantially more than 1 W could be drawn from the system in Case 0. In Case 1, however, the voltage drop from point 1U to 1T is 3V, at a power of only 0.7 W. This indicates that the available power in Case 1 is not much greater than the 0.7 W. If the system is properly characterized and/or modeled, the shape of the PV curves should be known and an accurate prediction of available power can be made using the two-point measurement. Note that the test power is not the same in case 0 as in case 1, but that this is not necessary to determine available power.

TABLE 1

PV points for the example scenario

| Point | Load Power | Rectified Voltage |
|---|---|---|
| 0U | 0 W | 16 V |
| 0T | 1 W | 15.5 V |
| 1U | 0 W | 16 V |
| 1T | 0.7 W | 13 V |

Figure 5:
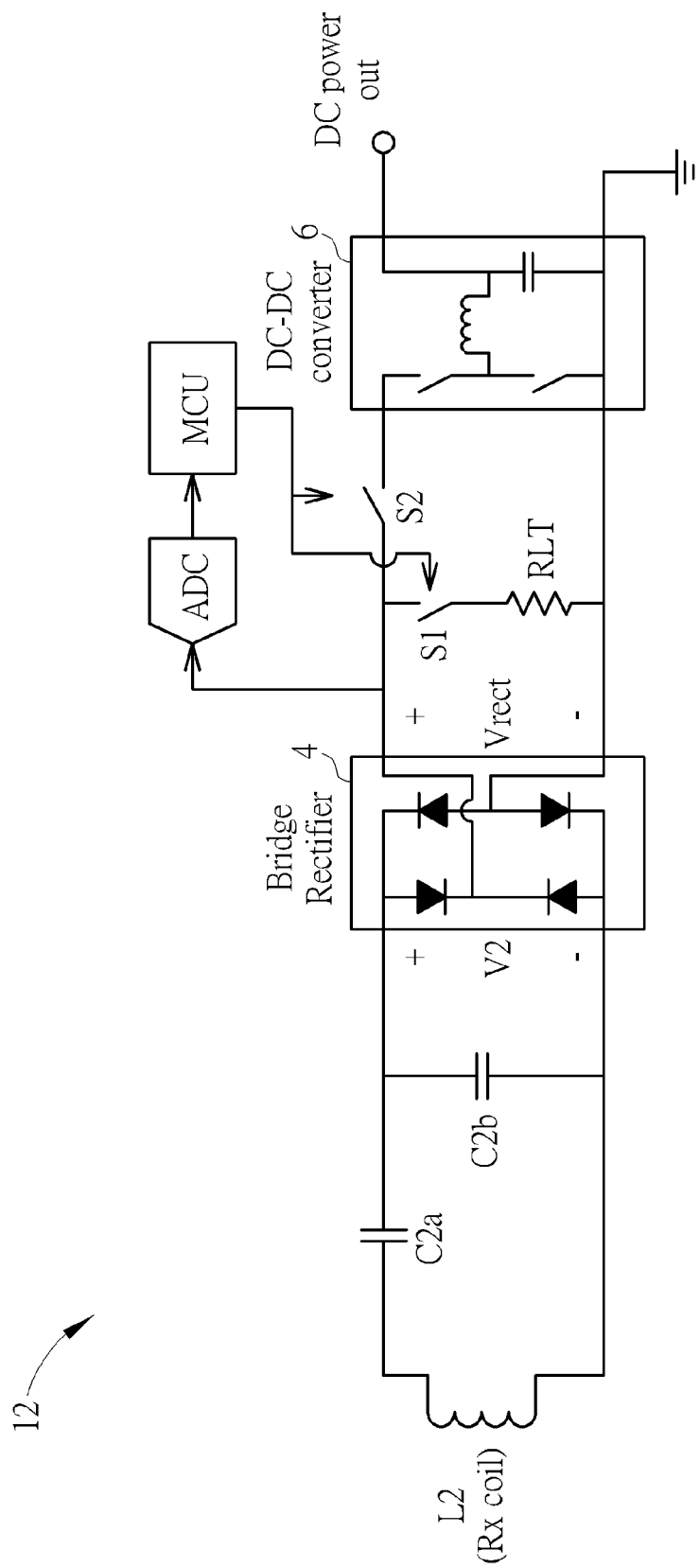
FIG. 5 is a schematic diagram illustrating a circuit for implementing test-load methodology used in accordance with the invention.

The circuit 12 for making the two-point measurement is shown in FIG. 5. When switch S1 is open and the gating switch S2 is open, the unloaded measurement can be taken using the analog-to-digital converter (ADC). When switch S1 is closed and the gating switch S2 is open, the resistor RLT loads the wireless power system and the test-resistance measurement can be taken using the ADC. Each measurement is made by measuring the voltage at Vrect. As the measurements are made, they can be stored in a microcontroller unit (MCU) memory. The MCU can then perform a calculation to determine the available power, using an equation or lookup table. If the available power is determined to be sufficient to drive the functional load circuit, the switch S1 is opened, gating switch S2 is closed and power is delivered to the functional load circuit.

Instead of opening switch S2, the dc-dc converter that conditions the output from the wireless power receiver can be disabled to disconnect the functional load from the receiver. Vrect can be connected directly to the dc-dc converter if this implementation is chosen. The dc-dc converter can be replaced by a linear regulator, or omitted entirely if it is not necessary to regulate the output power.

Instead of a test resistor, a test current sink can be used to draw a known power from the rectified voltage. The test load could be applied in the ac circuit, in front of the rectifier, with the same effect.

This provides a novel technique by which a wireless power receiver can independently make a measurement of instantaneous available power allowing a receiver to use this information to intelligently control its power draw, ensuring a good user experience.

Although the present invention has been shown and described with respect to several preferred embodiments thereof, various changes, omissions and additions to the form and detail thereof, may be made therein, without departing from the spirit and scope of the invention.

What is claimed is:

1. A wireless power receiver comprising:
   a rectifier circuit that converts an alternating current (AC) signal from a wireless coupler to a rectified signal; and
   a controller configured to:
   measure a first voltage of the rectified signal and a first power of the rectified signal when the rectifier circuit is coupled to a first output impedance;
   measure a second voltage and a second power of the rectified signal when the rectifier circuit is coupled to a second output impedance;
   calculate a third power that is an amount of power that can be drawn by the wireless power receiver from a wireless power source without reaching an overload condition, wherein the third power is calculated using the first voltage, the first power, the second voltage and the second power;
   adjust a power drawn from the wireless power source based upon the third power; and
   disconnect the wireless power receiver from a load circuit until the controller determines that the third power is sufficient to drive the load circuit.

2. The wireless power receiver of claim 1, wherein the wireless power receiver comprises a regulator to convert the rectified signal to a regulated output signal.

3. The wireless power receiver of claim 1, further comprising an analog-to-digital converter (ADC) configured to digitize the rectified signal.

4. The wireless power receiver of claim 1, wherein the controller comprises a microcontroller unit (MCU) that controls a plurality of power switches.

5. The wireless power receiver of claim 4, wherein one of the plurality of power switches is used to disconnect the wireless power receiver from the load circuit until the controller determines that the third power is sufficient to drive the load circuit.

6. The wireless power receiver of claim 5, wherein the second voltage and the second power are measured using a resistive element coupled to another of the plurality of power switches.

7. The wireless power receiver of claim 1, wherein the first voltage and the first power are measured by coupling the rectifier circuit to an open circuit impedance.

8. The wireless power receiver of claim 1, wherein the controller is further configured to compute the third power based on an equation or a lookup table.

9. A method of determining power available to a wireless power receiver comprising:
   converting an alternating current (AC) signal to a rectified signal using a rectifier circuit;
   measuring a first voltage of the rectified signal and a first power of the rectified signal when the rectifier circuit is coupled to a first output impedance;

measuring a second voltage of the rectified signal and a second power of the rectified signal when the rectifier circuit is coupled to a second output impedance;

calculating a third power that is an amount of power that can be drawn by the wireless power receiver from a wireless power source without reaching an overload condition, wherein the third power is calculated using the first voltage, the first power, the second voltage and the second power;

adjusting a power drawn from the wireless power source based upon the third power; and disconnecting the wireless power receiver from a load circuit until a controller determines that the third power is sufficient to drive the load circuit.

10. The method of claim 9, further comprising converting the rectified signal to a regulated output signal.

11. The method of claim 9, further comprising performing analog-to-digital conversion of the rectified signal.

12. The method of claim 9, wherein measuring the first voltage and the first power is performed using an open-circuit measurement.

13. The method of claim 9, wherein the second output impedance is provided by a resistive element.

14. A wireless power receiver comprising:

a rectifier circuit that converts an alternating current (AC) signal from a wireless coupler to a rectified signal;

a first switch that selectively couples the rectifier circuit to a load circuit; and a second switch that selectively couples the rectifier circuit to a resistive element;

wherein the first switch and the second switch are controlled by a controller configured to:

measure a first voltage of the rectified signal and a first power of the rectified signal when the rectifier circuit is coupled to a first output impedance;

measure a second voltage and a second power of the rectified signal when the rectifier circuit is coupled to a second output impedance;

calculate a third power that is an amount of power that can be drawn by the wireless power receiver from a wireless power source without reaching an overload condition, wherein the third power is calculated using the first voltage, the first power, the second voltage and the second power;

adjust a power drawn from the wireless power source based upon the third power; and disconnect the wireless power receiver from the load circuit until the controller determines that the third power is sufficient to drive the load circuit.

15. A method of determining power available to a wireless power receiver comprising:

converting an alternating current (AC) signal to a rectified signal using a rectifier circuit;

opening a switch to present an open circuit output impedance to the rectifier circuit;

measuring a first voltage of the rectified signal and a first power of the rectified signal when the rectifier circuit is coupled to the open circuit output impedance coupling the output of the rectifier circuit to a resistive element;

measuring a second voltage of the rectified signal and a second power of the rectified signal when the rectifier circuit is coupled to the resistive element;

calculating a third power that is an amount of power that can be drawn by the wireless power receiver from a wireless power source without reaching an overload condition, wherein the third power is calculated using the first voltage, the first power, the second voltage and the second power;

adjusting a power drawn from the wireless power source based upon the third power; and disconnecting the wireless power receiver from a load circuit until a controller determines that the third power is sufficient to drive the load circuit.

* * * * *